United States Patent
Johnson

(10) Patent No.: US 9,806,713 B2
(45) Date of Patent: Oct. 31, 2017

(54) CAPACITIVE TOUCH BUTTON WITH GUARD

(75) Inventor: Ronald Douglas Johnson, Westfield, IN (US)

(73) Assignee: Thomson Licensing, Issy les Moulineaux (FR)

( * ) Notice: Subject to any disclaimer, the term of this patent is extended or adjusted under 35 U.S.C. 154(b) by 325 days.

(21) Appl. No.: 14/400,073

(22) PCT Filed: May 15, 2012

(86) PCT No.: PCT/US2012/037915
§ 371 (c)(1),
(2), (4) Date: Nov. 10, 2014

(87) PCT Pub. No.: WO2013/172820
PCT Pub. Date: Nov. 21, 2013

(65) Prior Publication Data
US 2015/0144475 A1    May 28, 2015

(51) Int. Cl.
G01R 17/00 (2006.01)
H03K 17/96 (2006.01)

(52) U.S. Cl.
CPC ......... *H03K 17/9622* (2013.01); *G01R 17/00* (2013.01); *H03K 2217/94026* (2013.01);
(Continued)

(58) Field of Classification Search
CPC ................ G01R 27/2605; G06F 3/044; G06F 2203/041; G06F 3/03547; G06F 3/041;
(Continued)

(56) References Cited

U.S. PATENT DOCUMENTS

| 7,786,981 B2 | 8/2010 | Proctor |
| 8,004,497 B2 | 8/2011 | Xiaoping |

(Continued)

FOREIGN PATENT DOCUMENTS

| JP | 201139662 | 2/2011 |
| JP | 2011039662 | 2/2011 |

(Continued)

OTHER PUBLICATIONS

Energy Micro As, "Hardware Design for Capacitive Touch", EFM32, AN0040—Application note, www.energymicro.com, Mar. 7, 2012, 22 pages.

(Continued)

*Primary Examiner* — Tung X Nguyen
*Assistant Examiner* — Robert P Alejnikov, Jr.
(74) *Attorney, Agent, or Firm* — Brian J. Dorini; Michael A. Pugel

(57) ABSTRACT

An apparatus, such as a set-top box, includes at least one capacitive touch button with a guard feature that provides, among other things, the ability to detect and reject false touches. According to an exemplary embodiment, the apparatus includes a first conductive element that is capacitively isolated from ground, and a second conductive element that is capacitively isolated from ground and located adjacent to the first conductive element. A first sensor is coupled to the first conductive element and measures a change in capacitance between the first conductive element and ground due to a change in physical environment. A second sensor is coupled to the second conductive element and measures a change in capacitance between the second conductive element and ground due to the change in physical environment. A controller is coupled to the first sensor and the second sensor and determines a difference between the measured (Continued)

changes in capacitance of the first sensor and the second sensor.

27 Claims, 7 Drawing Sheets

(52) U.S. Cl.
CPC ............ *H03K 2217/960705* (2013.01); *H03K 2217/960715* (2013.01); *H03K 2217/960765* (2013.01)

(58) Field of Classification Search
CPC .... G06F 3/0412; G06F 3/0414; G06F 3/0416; G06F 3/0418; G06F 3/046; G06F 3/047; G06F 2203/04107; G06F 2203/04111; H05K 9/0073; H05K 9/0079; H05K 9/0081; H05K 9/0088
USPC ............................ 324/658–690; 345/173–178
See application file for complete search history.

(56) References Cited

U.S. PATENT DOCUMENTS

2006/0227115 A1* 10/2006 Fry ..................... H03K 17/962 345/173
2008/0136792 A1* 6/2008 Peng ..................... G06F 3/0416 345/174
2008/0143671 A1* 6/2008 Li ........................... G06F 3/023 345/156
2009/0184920 A1* 7/2009 Francis ............... G06F 3/03547 345/156
2009/0295409 A1 12/2009 Irkliy
2010/0109917 A1* 5/2010 Rudd ................... H03K 17/962 341/20
2011/0096011 A1* 4/2011 Suzuki ................. G06F 3/0418 345/173
2011/0242002 A1 10/2011 Kaplan et al.
2012/0037485 A1 2/2012 Sitarski
2012/0105353 A1 5/2012 Brosnan

FOREIGN PATENT DOCUMENTS

WO WO9747976 12/1997
WO WO9747976 A2 12/1997

OTHER PUBLICATIONS

International Search Report dated Aug. 10, 2012.
English Machine Translation of JP2011039662, obtained from Espacenet at www.epo.org; 28 pages.

* cited by examiner

CAPACITIVE TOUCH BUTTON WITH GUARD

This application claims the benefit, under 35 U.S.C. §365 of International Application PCT/US2012/037915, filed May 15, 2012, which was published in accordance with PCT Article 21(2) on Apr. 10, 2014 in English.

BACKGROUND OF THE INVENTION

Field of the Invention

The present disclosure generally relates to user input mechanisms, and more particularly, to any type of device, apparatus and/or system having at least one capacitive touch button with a guard feature that provides, among other things, the ability to detect and reject false touches.

Background Information

This section is intended to introduce the reader to various aspects of art, which may be related to the present embodiments that are described below. This discussion is believed to be helpful in providing the reader with background information to facilitate a better understanding of the various aspects of the present disclosure. Accordingly, it should be understood that these statements are to be read in this light.

Home and mobile user devices often include one or more buttons as part of a user interface. These interfaces may often rely on using one or more capacitive touch type buttons in place of more conventional tactile or positive pressure type buttons. With a capacitive touch button there may be no mechanical feedback to indicate that a button press has occurred. This can result in user confusion and/or frustration. For example, with certain conventional electronic devices (e.g., set-top boxes, etc.), it may be relatively easy for a user to accidentally turn the device off while simply repositioning the device if, for instance, the user puts his or her palm over a capacitive power button of the device. One approach for attempting to reject false positives is to simply change the sensitivity of a capacitive sensor associated with the capacitive touch button. However, such an approach alone is deemed less than optimal.

Accordingly, there is a need in the art to address the foregoing issues and thereby provide an improved design for a capacitive touch button. The present embodiments described herein address these and/or other issues.

SUMMARY OF THE INVENTION

In accordance with an aspect of the present disclosure, an apparatus is disclosed. According to an exemplary embodiment, the apparatus includes a first conductive element that is capacitively isolated from ground, and a second conductive element that is capacitively isolated from ground and located adjacent to edges of the first conductive element. A first sensor is coupled to the first conductive element and measures a change in capacitance between the first conductive element and ground due to a change in physical environment. A second sensor is coupled to the second conductive element and measures a change in capacitance between the second conductive element and ground due to the change in physical environment. A controller is coupled to the first sensor and the second sensor and determines a difference between the measured changes in capacitance of the first sensor and the second sensor.

In accordance with another aspect of the present disclosure, a method is disclosed. According to an exemplary embodiment, the method includes measuring a change in capacitance between a first conductive element and ground due to a change in physical environment; measuring a change in capacitance between a second conductive element and ground due to the change in physical environment, wherein the second conductive element is located adjacent to substantially all surface edges of the first conductive element; and determining a difference between the measured changes in capacitance.

The aforementioned summary of preferred and exemplary embodiments of the present disclosure is merely illustrative of the inventive concepts presented herein, and is not intended to limit the scope of the present disclosure in any manner.

BRIEF DESCRIPTION OF THE DRAWINGS

The above-mentioned and other features and advantages of this disclosure, and the manner of attaining them, will become more apparent and the disclosure will be better understood by reference to the following description of embodiments of the disclosure taken in conjunction with the accompanying drawings, wherein.

Figure 1:
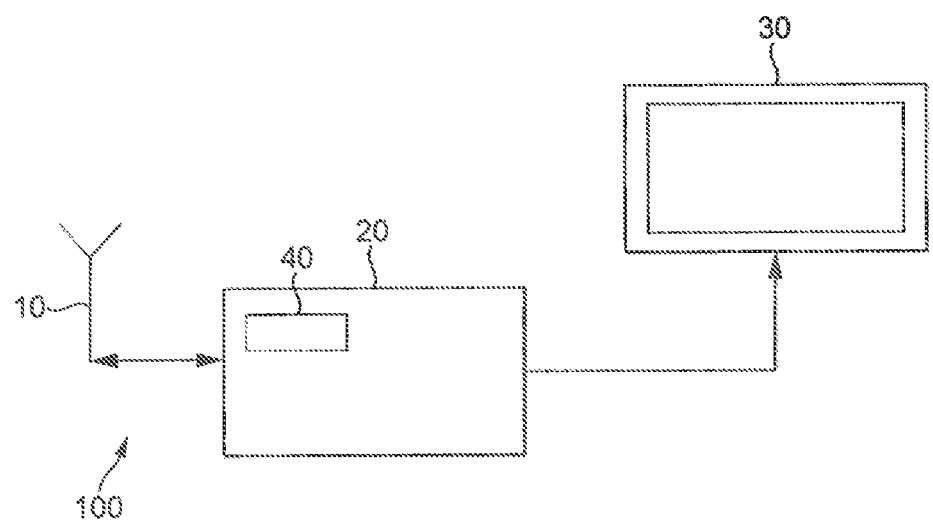
FIG. 1 shows a general block diagram of a system according to an exemplary embodiment of the present disclosure.

The exemplifications set out herein illustrate preferred embodiments of the disclosure, and such exemplifications are not to be construed as limiting the scope of the disclosure in any manner.

DESCRIPTION OF THE PREFERRED EMBODIMENTS

It should be understood that the elements shown in the figures may be implemented in various forms of hardware, software or combinations thereof. Preferably, these elements are implemented in a combination of hardware and software on one or more appropriately programmed general-purpose devices, which may include a processor, memory and input/output interfaces. Herein, the phrase "coupled" is defined to mean directly connected to or indirectly connected with through one or more intermediate components. Such intermediate components may include both hardware and software based components.

The present description illustrates the principles of the present disclosure. It will thus be appreciated that those skilled in the art will be able to devise various arrangements that, although not explicitly described or shown herein, embody the principles of the disclosure and are included within its scope.

All examples and conditional language recited herein are intended for educational purposes to aid the reader in understanding the principles of the disclosure and the concepts contributed by the inventor to furthering the art, and are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that the block diagrams presented herein represent conceptual views of illustrative circuitry embodying the principles of the disclosure. Similarly, it will be appreciated that any flow charts, flow diagrams, state transition diagrams, pseudocode, and the like represent various processes which may be substantially represented in computer readable media and so executed by a computer or processor, whether or not such computer or processor is explicitly shown.

The functions of the various elements shown in the figures may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, read only memory (ROM) for storing software, random access memory (RAM), and nonvolatile storage.

Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

In the claims hereof, any element expressed as a means for performing a specified function is intended to encompass any way of performing that function including, for example, a) a combination of circuit elements that performs that function or b) software in any form, including, therefore, firmware, microcode or the like, combined with appropriate circuitry for executing that software to perform the function. The disclosure as defined by such claims resides in the fact that the functionalities provided by the various recited means are combined and brought together in the manner which the claims call for. It is thus regarded that any means that can provide those functionalities are equivalent to those shown herein.

The present disclosure relates to an apparatus and method that controls the operation of a capacitor touch button or capacitive touch panel. The apparatus and method address problems associated with unintentional touches to the button or touch panel by providing discrimination between contact, or touching, intended for a button and contact, or touching, that covers the button along with an area around the button. Although the embodiments described below primarily focus on use in a set top box receiver device setting, aspects of the present disclosure may equally apply to other consumer and commercial devices that utilize touch buttons or touch panels including, but not limited to, computers, tablets, cellular phones, televisions, internet or product kiosks, and the like.

Referring now to the drawings, and more particularly to FIG. 1, a general block diagram of a system 100 according to an exemplary embodiment of the present disclosure is shown. As indicated in FIG. 1, exemplary system 100 comprises a signal source 10, a receiving apparatus 20 and a display device 30. According to an exemplary embodiment, system 100 may represent a digital satellite receiving system in which signal source 10 is embodied as a satellite antenna and receiving apparatus 20 is embodied as a digital set-top box, gateway and/or other device. However, this type of arrangement is exemplary only, and system 100 may represent other types of systems, such as systems operative to receive and process signals provided via cable, terrestrial, internet and/or other signal sources.

According to exemplary embodiments, receiving apparatus 20 is operative to receive and process signals in analog and/or digital modulation formats provided via signal source 10, and provide output signals suitable for display via display device 30. According to principles of the present disclosure, receiving apparatus 20 comprises a user input portion 40 that utilizes capacitive touch sensor technology, and includes at least one capacitive touch button with a guard feature. As will be described later herein, the aforementioned type of capacitive touch button with guard feature advantageously provides, among other things, the ability to detect and reject false button touches.

Figure 2:
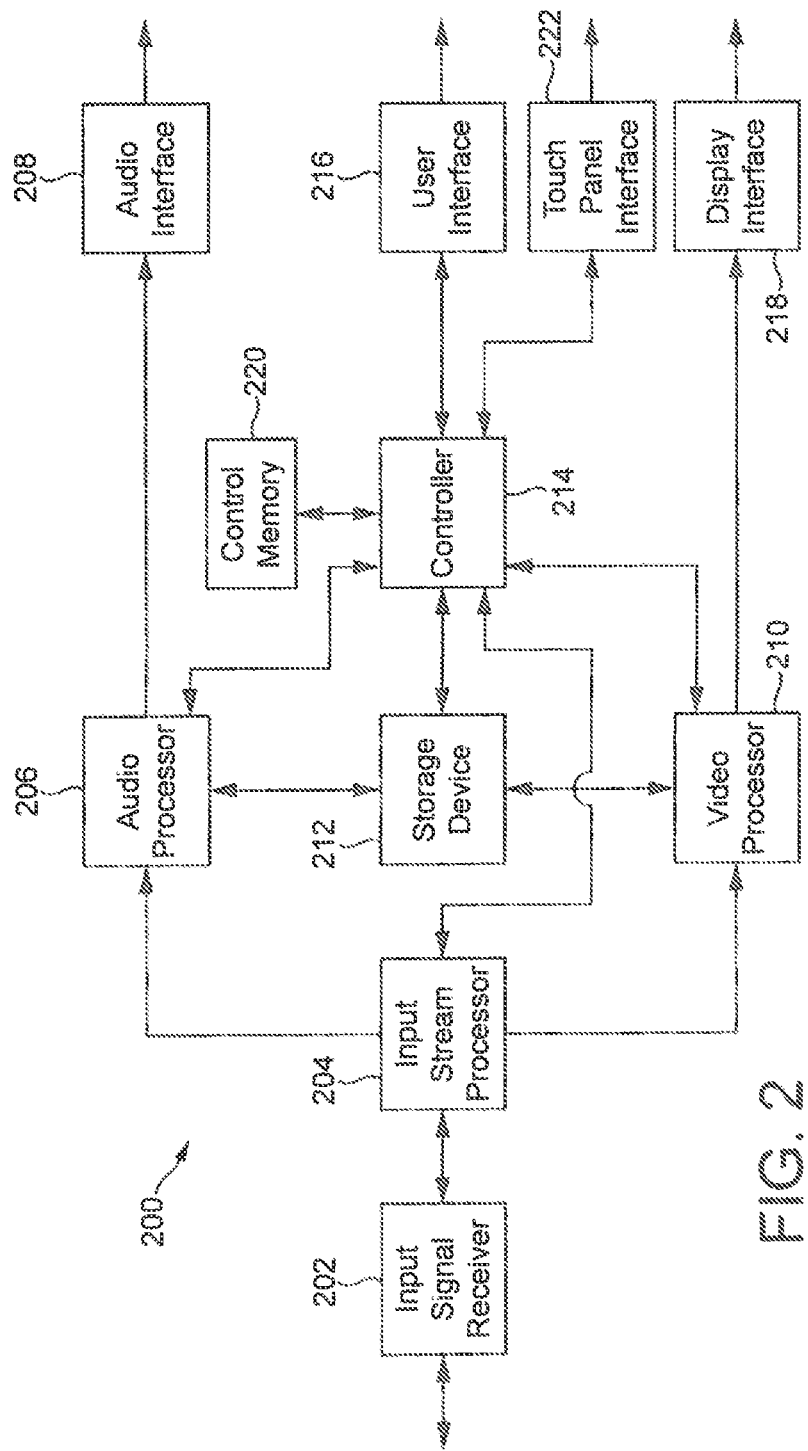
FIG. 2 shows a more detailed block diagram of a receiving apparatus according to an exemplary embodiment of the present disclosure.

Referring now to FIG. 2, a more detailed block diagram of a receiving apparatus 200 according to an exemplary embodiment of the present disclosure is shown. Receiving apparatus 200 of FIG. 2 may operate in a manner similar to receiving apparatus 20 described in FIG. 1 and may, for example, be included as part of a gateway device, modem, set-top box, or other similar communications device. Receiving apparatus 200 may also be incorporated into other systems including an audio device or a display device. In either case, several components necessary for complete operation of the system are not shown in the interest of conciseness, as they are well known to those skilled in the art.

In FIG. 2, content is received by receiving apparatus 200 via an input signal receiver 202. Input signal receiver 202 may be one of several known receiver circuits used for receiving, demodulating, and decoding signals provided over one of the several possible networks including over the air, cable, satellite, Ethernet, fiber and phone line networks. The desired input signal may be selected and retrieved by input signal receiver 202 based on user input provided through a control interface (not shown) or a touch panel interface 222.

Touch panel interface 222 may include an interface for a touch screen device. Touch panel interface 222 may also be adapted to interface to a cellular phone, a tablet, a mouse, a high end remote or the like. According to exemplary embodiments, touch panel interface 222 may also employ capacitive touch sensor technology, and include at least one capacitive touch button with a guard feature, as referenced above in conjunction with FIG. 1, and further described below.

The decoded output signal of input signal receiver 202 is provided to an input stream processor 204. Input stream processor 204 performs the final signal selection and processing, and includes separation of video content from audio content for the content stream. The audio content is provided to an audio processor 206 for conversion from the received format, such as compressed digital signal, to an analog waveform signal. The analog waveform signal is provided to an audio interface 208 and further to the display device or audio amplifier. Alternatively, audio interface 208 may provide a digital signal to an audio output device or display device using a High-Definition Multimedia Interface (HDMI) cable or alternate audio interface such as via a Sony/Philips Digital Interconnect Format (SPDIF). Audio interface 208 may also include amplifiers for driving one more sets of speakers. Audio processor 206 also performs any necessary conversion for the storage of the audio signals.

The video output signal from input stream processor 204 is provided to a video processor 210. The video signal may be one of several formats. Video processor 210 provides, as necessary, a conversion of the video content, based on the input signal format. Video processor 210 also performs any necessary conversion for the storage of the video signals.

A storage device 212 stores audio and video content received at the input. Storage device 212 allows later retrieval and playback of the content under the control of a controller 214 and also based on commands (e.g., navigation instructions such as fast-forward (FF) and rewind (Rew)) received from a user interface 216 and/or touch panel interface 222. Storage device 212 may be a hard disk drive, one or more large capacity integrated electronic memories, such as static RAM (SRAM), or dynamic RAM (DRAM), or may be an interchangeable optical disk storage system such as a compact disk (CD) drive or digital video disk (DVD) drive.

The converted video signal provided from video processor 210, either originating from the input or from storage device 212, is provided to display interface 218 which further provides the display signal to a display device of the type described above. Display interface 218 may be an analog signal interface, such as red-green-blue (RGB), or may be a digital interface such as HDMI.

Controller 214 is interconnected via a bus to several of the components of receiving apparatus 200, including input stream processor 202, audio processor 206, video processor 210, storage device 212, and user interface 216. Controller 214 manages the conversion process for converting the input stream signal into a signal for storage on the storage device or for display, and also manages the retrieval and playback of stored content. Controller 214 also provides control outputs in response to user inputs via user interface 216 and touch panel interface 222.

Controller 214 is further coupled to control memory 220 (e.g., volatile or nonvolatile memory, including RAM, SRAM, DRAM, ROM, programmable ROM (PROM), flash memory, electronically programmable ROM (EPROM), electronically erasable programmable ROM (EEPROM), etc.) for storing information and instruction code for controller 214. Control memory 220 may store instructions for controller 214, and may also store a database of elements, such as text and/or graphic elements containing content.

User interface 216 ideally includes a front panel assembly containing one or more buttons. According to exemplary embodiments, at least one of these buttons employs capacitive touch sensor technology and is embodied as a capacitive touch button with a guard feature, as referenced above in conjunction with FIG. 1, and further described below.

Figure 3:
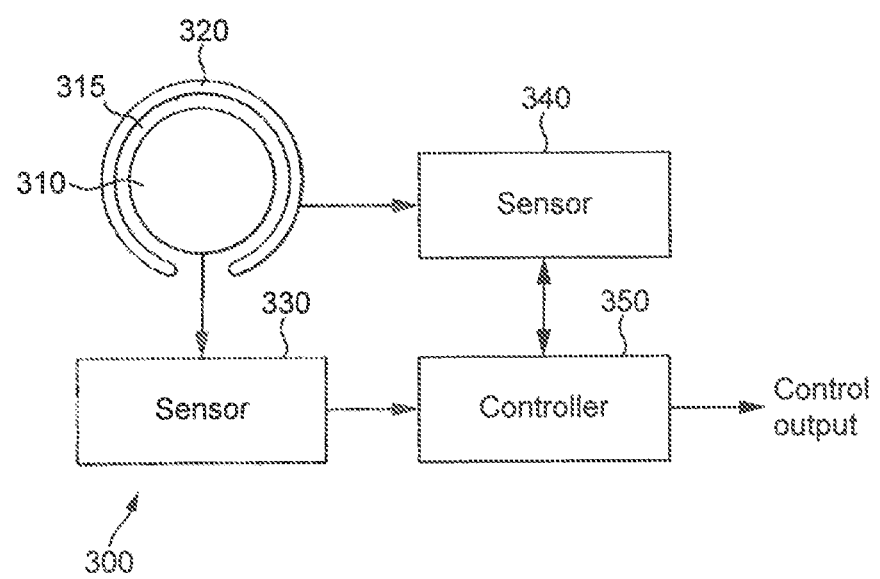
FIG. 3 shows a configuration including a capacitive touch button with guard according to an exemplary embodiment of the present disclosure.

Referring to FIG. 3, a configuration 300 including a capacitive touch button with guard according to an exemplary embodiment of the present disclosure is shown. Exemplary configuration 300 may be employed in various different types of devices, apparatuses and/or systems, such as receiving device 20 of FIG. 1 and/or receiving device 200 of FIG. 2. As indicated in FIG. 3, exemplary configuration 300 comprises a first conductive element 310, a second conductive element 320, a first sensor 330, a second sensor 340, and a controller 350.

According to exemplary embodiments, first conductive element 310 is capacitively isolated from ground and represents a main portion of a capacitive touch button, and second conductive element 320 is capacitively isolated from ground and represents a guard portion of the capacitive touch button. First and second conductive elements 310 and 320 may be embodied, for example, as conductive pads. The capacitive touch button may represent, for example, a main, or power, button of the applicable apparatus, device and/or system.

Also according to exemplary embodiments, second conductive element 320 is located adjacent to substantially all surface edges of first conductive element 310. Furthermore, the second conductive element 320 may be concentric with the first conductive element 310. A gap 315 exists between first and second conductive elements 310 and 320. Such gap 315 may be uniform along the respective surface edges of first and second conductive elements 310 and 320, or may vary as a matter of design choice. The gap 315 may include only an air gap, or alternatively may include another dielectric and nonconductive material. Additionally, a conductive ground surface (not shown) may be present either outside the conductive element 320 or, alternatively, below the first conductive element 310 and/or the second conductive element 320. The gap between the conductive ground surface and the conductive elements 310 and 320 may include an air gap or may include a dielectric material.

In the exemplary embodiment of FIG. 3, first conductive element 310 is shown as a circular element and second conductive element 320 extends circumferentially around substantially all of first conductive element 310 in a ring-like manner. The shape and size of second conductive element 320 (i.e., the guard portion) can be modified to allow for different types of presses. For instance, a user interface directly in front of the user would work well poking directly at the center of the pad. A horizontal touch interface may allow the user to lay their finger more horizontally. In this case, second conductive element 320 could be cut away to prevent detecting it as a false press.

Accordingly, the configuration of FIG. 3 is exemplary only, and other types of complementary shapes may be used for first and second conductive elements 310 and 320 to thereby form different types of complementary configurations in which second conductive element 320 is located adjacent to substantially all surface edges of first conductive element 310. As referred to herein, "substantially all" means two-thirds or more.

According to another exemplary embodiment, second conductive element 320 may be located adjacent to, and extend around, only half or more of the surface edges of first conductive element 310. According to yet another exemplary embodiment, second conductive element 320 may be located adjacent to, and extend around, less than half of the surface edges of first conductive element 310. Second conductive element 320 may also be arranged as a plurality of individual segments, instead of one unitary segment as shown in FIG. 3. Moreover, second conductive element 320 could be configured as a unitary segment and extend around a plurality of different first conductive elements 310 (i.e., around a plurality of different buttons in a cluster, etc.) as, for example, a single common guard ring. In such a configuration, each button (i.e., first conductive element 310) would have its measurement compared to the measurement associated with the common guard ring (i.e., second conductive element 320) to determine if a valid user input has occurred at that particular button.

First sensor 330 is coupled to first conductive element 310 and is operative to measure a change in capacitance between first conductive element 310 and ground due to a change in the associated physical environment. Second sensor 340 is coupled to second conductive element 320 and is operative to measure a change in capacitance between second conductive element 320 and ground due to the change in the associated physical environment. Although shown as separate elements in FIG. 3, first and second sensors 330 and 340 may also be embodied as a single combined sensor.

According to an exemplary embodiment, the change in the physical environment associated with first and second conductive elements 310 and 320 occurs in response to a user's tactile interaction with the applicable apparatus, device and/or system. Such tactile interaction may be intended by the user as a valid user input/button press (e.g., to activate or de-activate the main power button, etc.), or may represent an invalid user input/button press (e.g., stray touching of a button while moving device, etc.).

Controller 350 is coupled to first sensor 330 and second sensor 340, and is operative to determine a difference between the changes in capacitance measured by first sensor 330 and second sensor 340 as a result of user input. According to exemplary embodiments, controller 350 determines that a given change in the physical environment associated with first and second conductive elements 310 and 320 represents a valid user input to the applicable apparatus, device and/or system if the determined difference is equal to or exceeds a predefined threshold. For example, if a user presses directly in the center of the button (i.e., the center of first conductive element 310), a relatively high capacitance will be measured by first sensor 330 and a relatively low capacitance will be measured by second sensor 340.

Conversely, controller 350 determines that a given change in physical environment associated with first and second conductive elements 310 and 320 does not represent a valid user input to the applicable apparatus, device and/or system if the determined difference is less than the predefined threshold. For example, the relative capacitance measured by first sensor 330 and second sensor 340 will be the same or similar if a user's palm or other body part is pressed up against first and second conductive elements 310 and 320. The relative capacitance may also be similar if someone presses their finger against both pads of first and second conductive elements 310 and 320.

Figure 4:
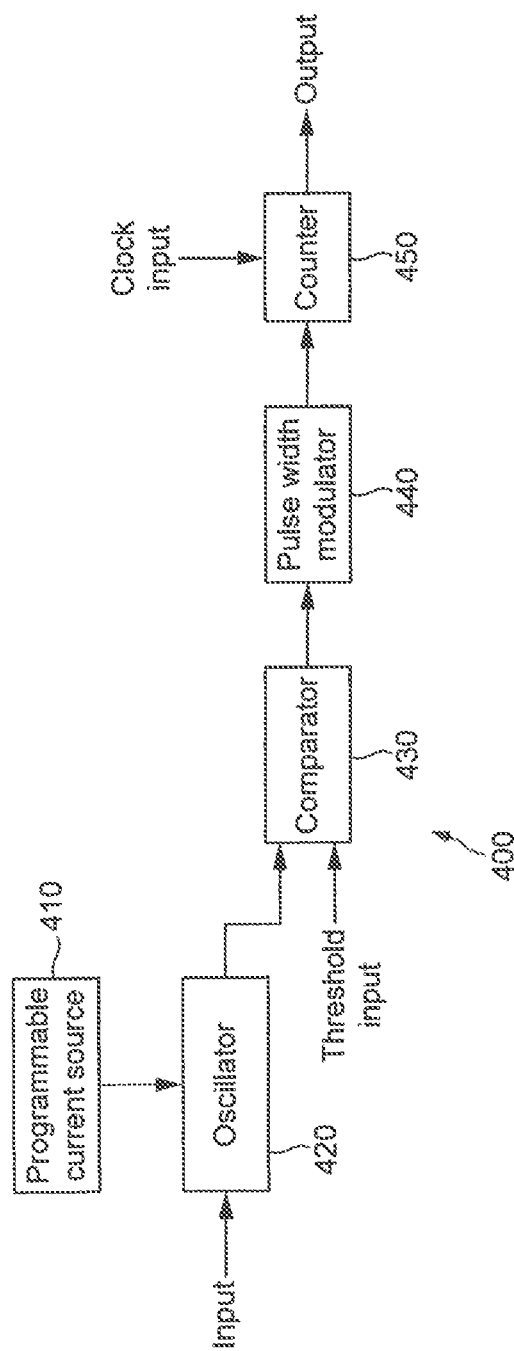
FIG. 4 shows an exemplary sensor circuit according to an embodiment of the present disclosure.

Turning now to FIG. 4, an exemplary sensor circuit 400 according to an embodiment of the present disclosure is shown. Sensor circuit 400 illustrates one of several possible circuits that may be used as part of first sensor 330 and second sensor 340 (shown in FIG. 3) for sensing the change in capacitance due to a user's tactile interaction with the button. Sensor 400 includes a programmable current source 410, a relaxation oscillator 420, precision analog comparator 430, a pulse width modulator 440, and a counter 450. The relaxation oscillator 420 operates at a nominal frequency based on the property of the conductive element (e.g., conductive element 310 and conductive element 320) connected at the input and is further controlled by the current source 410. The signal from the relaxation oscillator 420 is provided to the analog comparator 430. The output of the comparator 430 is fed into the clock input of the pulse width modulator 440, which gates the counter 450. Counter 450 also receives a clock input at a clock frequency used in the device (e.g., receiving device 20 of FIG. 1 and/or receiving device 200 of FIG. 2).

In operation, an object, such as the user's finger, on the conductive element increases the capacitance which lowers the frequency of the oscillator 420. This lowered frequency effectively decreases the count measured in the pulse width modulator 440 and counter 450. Other embodiments for capacitive sense circuits are possible and are well known to those skilled in the art. Further, portions of sensor circuit 400 described in this embodiment may be shared between the operation of more than capacitive sensor device in order to reduce space, cost, and/or complexity.

As defined earlier, the present embodiments are intended to identify false contact or button pushes by determining a difference between the changes in capacitance occurring in a first sensor (e.g., sensor 330 in FIG. 3) and a second, or guard, sensor (e.g., sensor 340 in FIG. 3) as a result of user input. Using the sensor circuit described in FIG. 4, the difference between the changes in capacitance is determined by comparing the counts measured for each of the sensor as a result of the change of capacitance. In one embodiment, a difference of 20 percent between the count value for the first sensor and the count value for the second sensor, with the first sensor value being lower, provides a determination that a proper button contact has been made. As a result, a corresponding predefined threshold may be set at a value of 20 percent of the count value determined for the second or guard sensor (e.g., sensor 340) when the first sensor count value is subtracted from the second sensor count value. It is important to note that in other embodiments, a different percentage difference may be used. In still other embodiments, using different sensor circuits, threshold values related to other determined parameters may be used.

Figure 5:
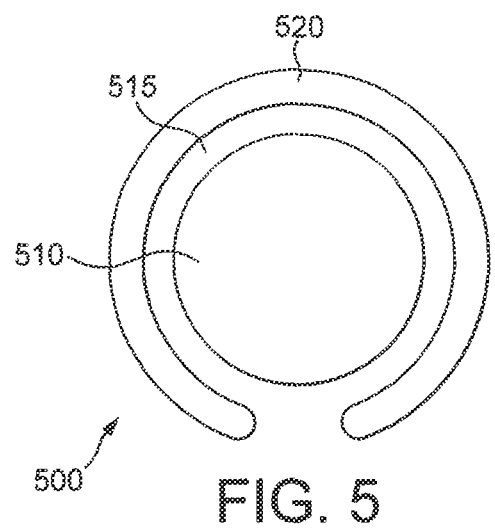
FIG. 5 shows a capacitive sensor element arrangement according to an exemplary embodiment of the present disclosure.

Referring now to FIG. 5, an exemplary embodiment of a capacitive sensor element arrangement 500 according to aspects of the present disclosure is shown. Arrangement 500 is similar in operation to elements 310, 315, and 320 shown in FIG. 3. However, arrangement 500 illustrates a non-uniform spacing 515 between element 510 and element 520, as was described earlier. Arrangement 500 may useful in environments that require a variation in sensitivity to changes in capacitance between the sensor elements 510 and 520.

Figure 6:
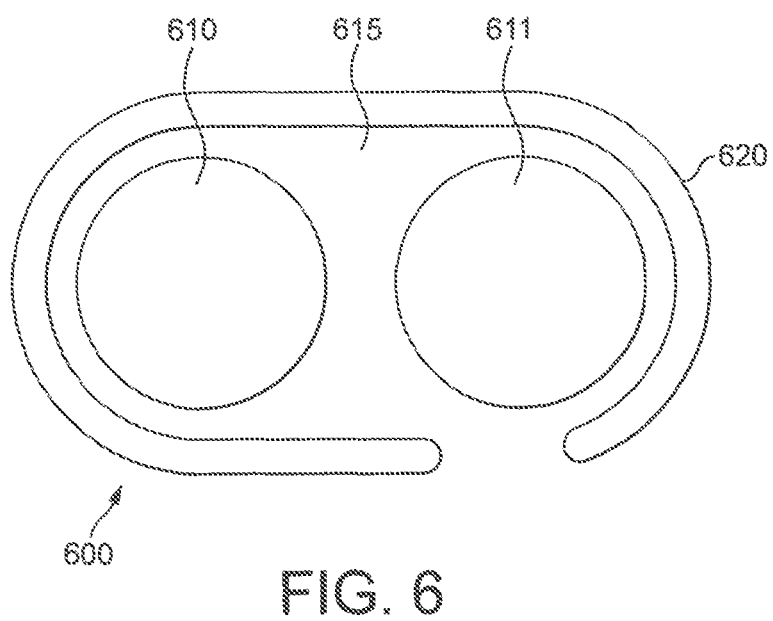
FIG. 6 shows a capacitive sensor element arrangement according to another exemplary embodiment of the present disclosure.

Referring now to FIG. 6, another exemplary embodiment of a capacitive sensor element arrangement 600 according to aspects of the present disclosure is shown. Arrangement 600 includes elements 610, 615, and 620, which are similar in operation to elements 310, 315, and 320 shown in FIG. 3. However, arrangement 600 includes two main or first elements, element 610 and element 611, representing touch buttons for the user. Element 620 is located adjacent to, or otherwise surrounds both element 610 and 611, providing a guard for both elements together, as was described earlier. Arrangement 600 may useful in environments that require a touch guard for a set of two or more buttons without influencing contact between the buttons.

Figure 7B:
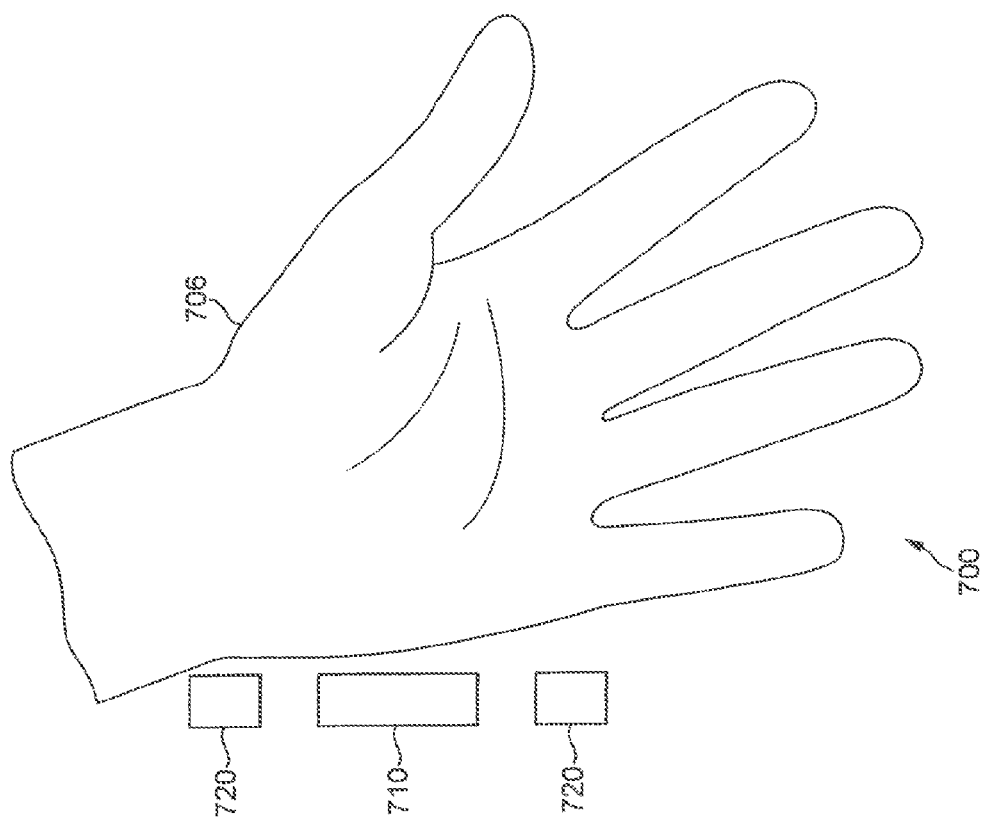
FIG. 7A and FIG. 7B show a view of a capacitive touch button with guard with various user inputs according to an exemplary embodiment of the present disclosure.
Figure 7A:
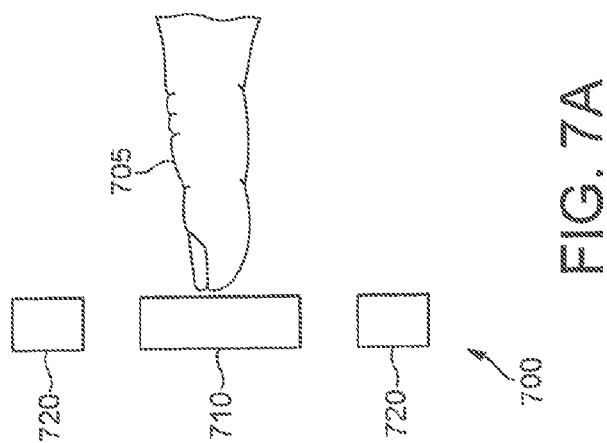

In a further perspective, FIG. 7A and FIG. 7B show a side view 700 of a capacitive touch button with guard with various user inputs according to an exemplary embodiment of the present disclosure. In particular, FIG. 7A and FIG. 7B show a view of first and second conductive elements 710 and 720. First and second conductive elements 710 and 720 may correspond to elements 310 and 320 shown in FIG. 3, or may correspond to the elements shown in FIG. 5 and/or FIG. 6. As indicated in FIG. 7A, a valid user input (i.e., button press) requires a user's finger 705 to press the center of first conductive element 710, resulting in an increase in capacitance on conductive element 710 without an increase in capacitance on conductive element 720. Conversely, as shown in FIG. 7B, a user's palm 706 or other type of accidental press by a user will cause a greater capacitance on both first and second conductive elements 710 and 720 leading to the signal being rejected as an invalid user input. In this manner, the present embodiment allows, among other things, better identification of the accuracy of a user's finger press and a reduction in false triggering due to inadvertent contact with a touch pad or button.

Figure 8:
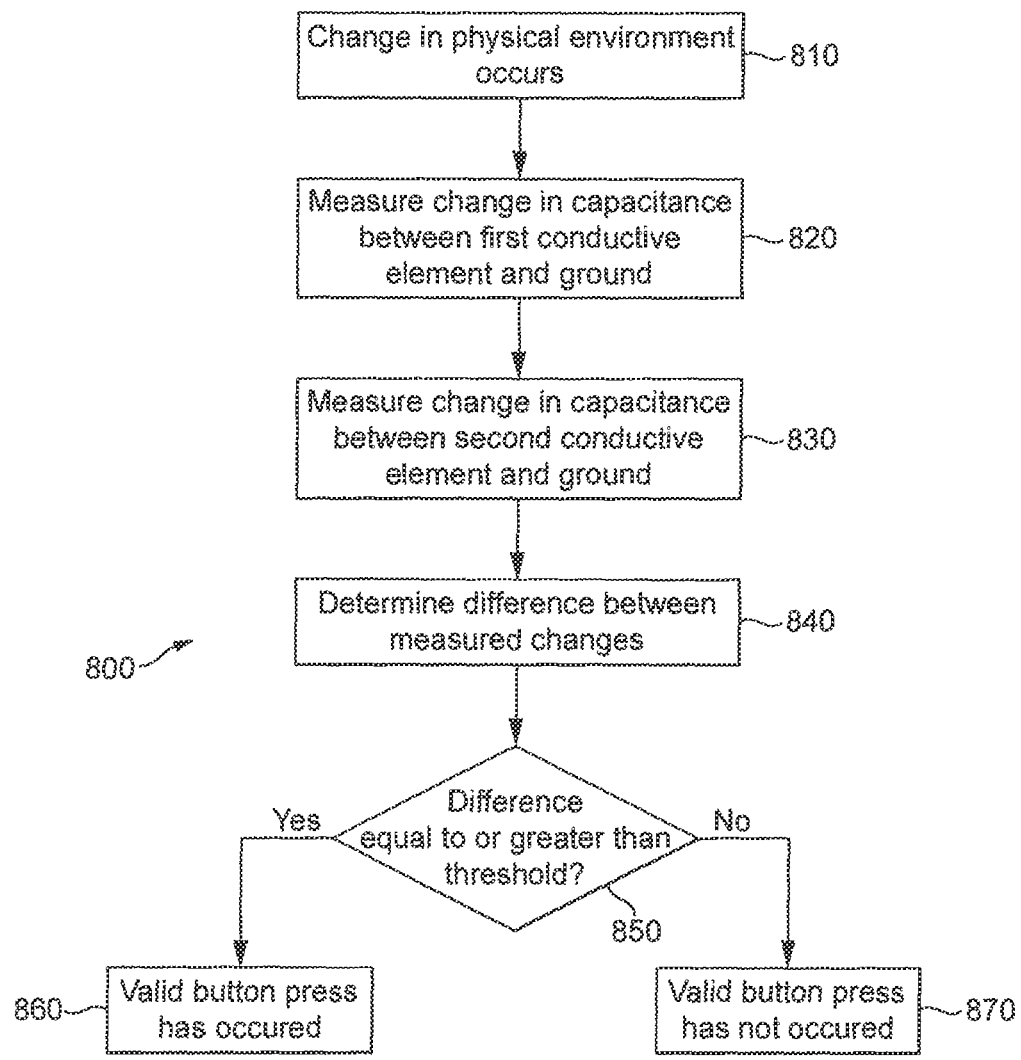
FIG. 8 shows a flow diagram according to an exemplary embodiment of the present disclosure.

Referring to FIG. 8, a flow diagram 800 according to an exemplary embodiment of the present disclosure is shown. For purposes of example and clarity of description only, the steps of FIG. 8 are described below with specific reference to the exemplary embodiments of FIGS. 3 and 7 described above. However, it should be intuitive to those skilled in the art that the inventive principles embodied in the flowchart of FIG. 8 may also be applied to systems, apparatuses, devices and/or implementations other than those specifically described herein. Accordingly, the steps of FIG. 8 are exemplary only, and are not intended to limit the applicability of the present disclosure in any manner.

At step 810, a change in the physical environment related to first and second conductive elements 310 and 320 in configuration 300 occurs. According to an exemplary embodiment, the change in physical environment occurs at step 810 in response to a user's tactile interaction with the applicable apparatus, device and/or system. Such tactile interaction may be intended by the user as a valid button press (e.g., to activate or de-activate the main power button, etc.), or may represent an invalid button press (e.g., stray touching of a button while moving device, etc.).

At step 820, first sensor 330 detects and measures a change in capacitance between first conductive element 310 and ground due to the change in physical environment that occurred at step 810.

At step 830, second sensor 340 detects and measures a change in capacitance between second conductive element 320 (i.e., the guard element) and ground due to the change in physical environment that occurred at step 810.

At step 840, controller 350 determines a difference between the measured changes in capacitance of first sensor 330 and second sensor 340. As indicated earlier herein, first and second sensors 330 and 340 may be combined as a single sensor.

At step 850, controller 350 determines if the difference determined at step 840 is equal to or greater than a predefined threshold (e.g., a value that is 20 percent of the value for second sensor 340). Such threshold may be initially set as a matter of design choice and/or be adjustable by a user of the applicable apparatus, device and/or system. According to exemplary embodiments, at step 850, controller 350 determines that a valid user input to the applicable apparatus, device and/or system has occurred if the determined difference at step 840 is equal to or exceeds a predefined threshold. For example, if a user presses directly in the center of the button (i.e., the center of first conductive element 310), a relatively high capacitance will be measured by first sensor 330 and a relatively low capacitance will be measured by second sensor 340

If the determination at step 850 is positive, process flow advances to step 860 where controller 350 determines that a valid button press has occurred as a result of the change in physical environment at step 510. That is, if it is determined at step 850 that the difference determined at step 840 equals or exceeds an established threshold, controller 350 determines at step 860 that the change in physical environment that occurred at step 810 represents a valid user input to the applicable apparatus, device and/or system. As a result of this determination, controller 350 may output a control signal to enable or disable the performance of a particular control function associated with the applicable apparatus, device and/or system.

Alternatively, if the determination at step 850 is negative, process flow advances to step 870 where controller 350 determines that a valid button press has not occurred as a result of the change in physical environment at step 810. That is, if it is determined at step 850 that the difference determined at step 840 is less than the threshold, controller 350 determines at step 870 that the change in physical environment that occurred at step 810 does not represent a valid user input to the applicable apparatus, device and/or system. As a result of this determination, controller 350 may ignore the change in physical environment that occurred at step 810.

The steps of FIG. 8 may also applied to arrangements, such as shown in FIG. 6, in which second conductive element 620 is configured as a unitary segment and extends around a plurality of different first conductive elements 610 and 611 (i.e., around a plurality of different buttons in a cluster, etc.) as, for example, a single common guard ring. With such arrangements, each button (i.e., conductive element 610, 611) would have its respective measurement compared to the measurement associated with the common guard ring (i.e., conductive element 620) to determine if a valid user input has occurred at that particular button. Other types of modifications to the steps of FIG. 8 may also be implemented according to principles of the present disclosure.

As described above, the present disclosure provides an improved design for a capacitive touch button which includes a guard feature that provides, among other things, the ability to detect and reject false touches. Such an inventive capacitive touch button may be utilized with any type of device, apparatus and/or system that includes one or more capacitive touch buttons.

While this disclosure has been described as having a preferred design, the present embodiments can be further modified within the scope of this disclosure. This application is therefore intended to cover any variations, uses, or adaptations of the embodiments using their general principles. Further, this application is intended to cover such departures from the present disclosure as come within known or customary practice in the art to which this disclosure pertains and which fall within the limits of the appended claims.

The invention claimed is:
1. An apparatus, comprising:
a first conductive element, the first conductive element capacitively isolated from ground;
a second conductive element, the second conductive element capacitively isolated from ground and located adjacent to edges of the first conductive element;

a first sensor coupled to the first conductive element, the first sensor measuring a change in capacitance between the first conductive element and ground due to a change in physical environment;
a second sensor coupled to the second conductive element, the second sensor measuring a change in capacitance between the second conductive element and ground due to the change in physical environment; and
a controller coupled to the first sensor and the second sensor, the controller determining a difference between the measured changes in capacitance of the first sensor and the second sensor,
wherein if the determined difference is equal to or exceeds a threshold, the controller determines that the change in physical environment represents a valid user input to the apparatus, and if the determined difference is less than the threshold, the controller determines that the change in physical environment does not represent a valid user input to the apparatus.

2. The apparatus of claim 1, wherein:
the first conductive element represents a first portion of a capacitive touch button; and
the second conductive element represents a second portion of the capacitive touch button.

3. The apparatus of claim 2, wherein the first portion of the capacitive touch button is a main portion of the capacitive touch button and the second portion of the capacitive touch button is a guard portion of the capacitive touch button.

4. The apparatus of claim 2, wherein the capacitive touch button is a power button of the apparatus.

5. The apparatus of claim 1, wherein:
the first conductive element is circular; and
the second conductive element is concentric with substantially all of the first conductive element.

6. The apparatus of claim 1, wherein the threshold is a value that is twenty percent of the value of the change in capacitance between the second conductive element and ground.

7. The apparatus of claim 1, wherein a gap between the first and second conductive elements is uniform along their respective surface edges.

8. The apparatus of claim 1, wherein a gap between the first and second conductive elements is not uniform along their respective surface edges.

9. The apparatus of claim 1, comprising a plurality of the first conductive elements, and wherein the second conductive element is configured as a unitary segment extending around the plurality of first conductive elements.

10. A method, comprising:
measuring a change in capacitance between a first conductive and ground due to a change in physical environment;
measuring a change in capacitance between a second conductive element and ground due to the change in physical environment, wherein the second conductive element is located adjacent to edges of the first conductive element;
determining a difference between the measured changes in capacitance;
determining that the change in physical environment represents a valid user input to an apparatus if the determined difference is equal to or exceeds a threshold; and
determining that the change in physical environment does not represent a valid user input to the apparatus if the determined difference is less than the threshold.

11. The method of claim 10, wherein:
the first conductive element represents a first portion of a capacitive touch button of an apparatus; and
the second conductive element represents a second portion of the capacitive touch button.

12. The method of claim 11, wherein the first portion of the capacitive touch button is a main portion of the capacitive touch button and the second portion of the capacitive touch button is a guard portion of the capacitive touch button.

13. The method of claim 11, wherein the capacitive touch button is a power button of the apparatus.

14. The method of claim 10, wherein:
the first conductive element is circular; and
the second conductive means is concentric with substantially all of the first conductive means.

15. The method of claim 10, wherein:
the first conductive element comprises a plurality of conductive elements; and
the second conductive element is configured as a unitary segment extending around the plurality of conductive elements.

16. The method of claim 10, wherein the threshold is a value that is twenty percent of the value of the change in capacitance between the second conductive element and ground.

17. The method of claim 10, wherein a gap between the first and second conductive elements is uniform along their respective surface edges.

18. The method of claim 10, wherein a gap between the first and second conductive elements is not uniform along their respective surface edges.

19. An apparatus, comprising:
first conductive means capacitively isolated from ground;
second conductive means capacitively isolated from ground and positioned adjacent to substantially all surface edges of the first conductive means;
means for measuring a change in capacitance between the first conductive means and ground due to a change in physical environment, and for measuring a change in capacitance between the second conductive means and ground due to the change in physical environment; and
means for determining a difference between the measured changes in capacitance,
wherein if the determined difference is equal to or exceeds a threshold, the determining means determines that the change in physical environment represents a valid user input to the apparatus, and
wherein if the determined difference is less than a threshold, the determining means determines that the change in physical environment does not represent a valid user input to the apparatus.

20. The apparatus of claim 19, wherein:
the first conductive means represents a first portion of a capacitive touch button; and
the second conductive means represents a second portion of the capacitive touch button.

21. The apparatus of claim 20, wherein the first portion of the capacitive touch button is a main portion of the capacitive touch button and the second portion of the capacitive touch button is a guard portion of the capacitive touch button.

22. The apparatus of claim 20, wherein the capacitive touch button is a power button of the apparatus.

23. The apparatus of claim 19, wherein:
the first conductive means is circular; and
the second conductive means is concentric with substantially all of the first conductive element.

24. The apparatus of claim 19, wherein the threshold is a value that is twenty percent of the value of the change in capacitance between the second conductive element and ground.

25. The apparatus of claim 19, wherein a gap between the first conductive means and second conductive means is uniform along their respective surface edges.

26. The apparatus of claim 19, wherein a gap between the first conductive means and second conductive means is not uniform along their respective surface edges.

27. The apparatus of claim 19, wherein the first conductive means comprises a plurality of the first conductive elements, and wherein the second conductive means is configured as a unitary segment extending around the plurality of first conductive elements.

* * * * *